United States Patent [19]

Hwang

[11] Patent Number: 5,568,352
[45] Date of Patent: Oct. 22, 1996

[54] CAPACITOR AND MANUFACTURING METHOD THEREOF

[75] Inventor: Cheol-Seong Hwang, Seongnam, Rep. of Korea

[73] Assignee: Samsung Electronics Co., Ltd., Suwon, Rep. of Korea

[21] Appl. No.: 558,399

[22] Filed: Nov. 16, 1995

[30] Foreign Application Priority Data

Jan. 26, 1995 [KR] Rep. of Korea ............... 95-1414

[51] Int. Cl.$^6$ ............... H01G 4/06; H01G 4/008; H01G 4/20; H01G 7/00
[52] U.S. Cl. ............... 361/321.4; 29/25.42; 437/919; 361/305; 361/313; 361/320; 361/321.5
[58] Field of Search ............... 361/301.4, 303–305, 361/306.1, 306.2, 306.3, 311–313, 320, 321.1, 321.2, 321.3, 321.4, 321.5, 322–323; 29/25.41, 25.42; 437/919

[56] References Cited

U.S. PATENT DOCUMENTS 5,187,638  2/1993  Sandhu et al. ............... 361/313
5,471,364  11/1995  Summerfelt et al. ............... 361/321.4

*Primary Examiner*—Bot L. Ledynh

[57] ABSTRACT

A capacitor in a semiconductor device and a manufacturing method for the capacitor are provided using a triple film including a Ti layer, a TiN layer, and a Ta layer. The capacitor has a first insulating film formed on the surface of a semiconductor substrate, the first insulating film having a center hole and at least one step between the center hole and the rest of the first insulating film, a spacer formed on the inner wall of the contact hole, a first conductive layer filling the contact hole, a triple film formed on the center of the first insulating film, a second conductive layer formed on the triple film, a second insulating film formed on the resultant structure, and a third conductive layer formed on the second insulating film. The Ta layer is placed in between the second conductive layer and both the Ti layer and the TiN layer to prevent the production of a metal oxide and nitrogen gas from a reaction between oxygen and the Ti and TiN layers.

20 Claims, 2 Drawing Sheets

CAPACITOR AND MANUFACTURING METHOD THEREOF

BACKGROUND OF THE INVENTION

The present invention relates to a semiconductor device and a manufacturing method for semiconductor device. More particularly, the invention relates to a capacitor having a triple diffusion barrier layer and a manufacturing method this kind of capacitor.

When used in a memory device, a capacitor must have an appropriate capacitance to smoothly operate the device. In DRAMs, the important factors involved in determining the required capacitance of the capacitor are its refresh errors and soft errors. These two factors are derived, respectively, from leakage current and from the alpha particles emitted from metal wiring. Each of these two factors exerts an adverse influence on the correct maintenance of the data stored in a memory cell. A capacitor in a memory device must have a capacitance large enough to retain a sufficient charge despite refresh and soft errors.

As DRAM integration level increases, the area that a capacitor can occupy in a cell correspondingly decreases. However, the capacitance required in a capacitor of a highly integrated memory cell does not decrease. In a 256-Mbit DRAM, for example, a capacitance of approximately 25 fF is required to prevent operational errors caused by the refresh and soft errors. A capacitor in a DRAM device must achieve the required capacitance while remaining within the limited area allowed for it in its memory cell.

In general, the capacitance C of a capacitor is given by the formula:

$$C = \frac{\epsilon \cdot s}{d}$$

here s is the surface area of a storage node in the capacitor, $\epsilon$ is the dielectric constant of a dielectric, and d is the thickness of the dielectric. Traditionally, capacitors were made of two parallel nodes, with the direct surface area of the storage node being used in the above equation.

In a small-area memory cell, however, a three-dimensional storage node structure such as a stacked node or a trench node may be adopted for a capacitor in a highly-integrated s memory cell to increase the effective surface area of the capacitor. In a DRAM of 64-Mbit or above, a three-dimensional storage node structure even more complicated than a stacked or trench node, e.g., a cylinder structure or a fin structure, is required to ensure a sufficiently large effective surface area for the capacitor. In a DRAM of 256-Mbit or above, which has a severe limit on the width of the capacitors, an available area of the capacitor must be further increased by raising the height of the three-dimensional storage node to a point high enough to provide the needed capacitance of 25 fF. Unfortunately, this requirement has the effect of lowering the production yield of a memory cell and raising the ultimate process cost by increasing the number of process steps required to make a capacitor. The number of steps increases because fine feature processing technology becomes necessary for the formation of the capacitor or an upper wiring when the storage node gets too high. It is therefore desirable to find a way to increase capacitance without increasing the height of a capacitor.

As can be seen from the above capacitance equation, for the capacitance to increase, the dielectric constant ($\epsilon$) or the effective surface area (s) of the capacitor must increase or the thickness (d) of the dielectric must decrease. The effective surface area of the capacitor is limited by the height and width of the capacitor as discussed above. The remaining elements of the equation depend upon the type of dielectric used. For example, the minimum thickness of the dielectric in the capacitor depends on the properties of the dielectric. Thus, to increase the capacitance, the dielectric can be chosen to have properties that reduce its minimum thickness. Alternatively, a dielectric having a high dielectric constant can be chosen. In either case, the capacitance of the memory cell capacitor will be increased.

In a 1-Mbit DRAM cell, an oxide film is grown on a semiconductor substrate and used as the dielectric film for the capacitors. In a 4-Mbit DRAM cell, a nitride film having a dielectric constant about twice that of the oxide film is used as the dielectric instead of the oxide film to increase cell reliability. In a 256-Mbit DRAM, it is necessary to use a dielectric having a larger dielectric constant than the oxide and nitride films. A dielectric with a small dielectric constant would impose unreasonable constraints on the fabrication process and manufacturing process technology of the capacitor. Currently, $Ta_2O_5$, PZT, $SrTiO_3$ and $(Ba, Sr)TiO_3$ (more simply, BST) are being explored as materials having sufficiently large dielectric constants for a 256-Mbit DRAM.

$Ta_2O_5$, for example, has a dielectric constant of about 20. To use this material for a 256-Mbit DRAM, a complex three-dimensional storage node structure like a cylinder or fin structure must be used. This has the disadvantage that it does not avoid complexity in the manufacturing of the capacitor.

PZT also has a large dielectric constant, but has the disadvantage that it is ferroelectric. This can lead to degradation of polarization reversal in the memory cell. As a result, an appropriate cell circuit design must be made or some other measure must be taken to avoid this problem before PZT can be used in a 256-Mbit DRAM.

The dielectric constant of BST is higher than that of $Ta_2O_5$, and BST is not appreciably ferroelectric at the operating temperature of a general device. As a result, a desired capacitance can be obtained with BST even using a simple stacked storage node in a 256-Mbit DRAM cell.

Nevertheless, BST does have some disadvantages. If, when using a BST film as a high dielectric film, a current storage node is formed of silicon, then an oxide film may be formed at the interface of the BST film and the storage node in the subsequent annealing process. This can lead to a decrease in the capacitance of the capacitor. To avoid this problem, a storage node is generally formed of a refractory metal such as platinum (Pt) when using BST as a high dielectric film. Unfortunately, Pt reacts with the silicon, the interface between the two becomes unstable, and silicon atoms diffuse through the Pt film into the BST film, thereby decreasing the dielectric constant of the BST.

To circumvent this problem, an appropriate diffusion barrier layer must be formed between a Pt electrode and a silicon layer. In a capacitor having a conventional diffusion barrier layer a Ti or TiN thin film is used, for example, "A Memory Cell Capacitor with $Ba_xSr_{1-x}TiO_3$(BST) Film for Advanced DRAMS," Symposium on VLSI Technology Digest of Technical Papers (1994). However, the Ti in each of these films may be oxidized by diffused oxygen. The oxygen atoms can pass through the Pt film and react with the Ti and TiN to produce a $TiO_x$ oxide and nitrogen gas. In addition, when a TiN thin film is used, the nitrogen gas resulting from the oxidation of the Ti is trapped at the interface of the Pt and TiN, thereby making the Pt film partially swollen, making its surface rough, and locally

3 lifting it off the substrate. The lift-off becomes severe when oxygen ions activated in the course of forming the BST film are generated. Furthermore, the lift-off takes place regardless of the thickness of the Pt and regardless of any prior processing of the TiN.

A capacitor manufacturing method in which the Ti film or TiN film is used as a diffusion barrier layer will be described in detail, referring to the attached drawings. FIGS. 1 to 3 illustrate the steps of this process in a conventional capacitor manufacturing method.

FIG. 1 shows the step of forming a first insulating film including the formulation of a contact hole. In this example, a borophosphosilicate glass (BPSG) film is formed as first insulating film 3 on a semiconductor substrate 1 having a transistor formed therein by a usual method. A photoresist (not shown) is formed on the overall surface of the first insulating film 3, from which a photoresist pattern 4 is formed to define a contact hole 7. The first insulating film 3 is then dry-etched, using photoresist pattern 4 as a mask, to form the contact hole 7. Afterwards, a spacer 5 is formed on the inner wall of the contact hole 7 and the photoresist pattern 4 is removed.

FIG. 2 shows the step of sequentially forming a diffusion barrier layer and a lower storage node. In more detail, a polysilicon layer (not shown) doped with a conductive impurity is formed on the overall surface of semiconductor substrate 1 including contact hole 7. Thereafter, the overall surface of the polysilicon layer is etched back and planarized. The etch-back is performed until the surface of first insulating film 3 is entirely exposed. As a result, the polysilicon layer on the first insulating film 3 and around the contact hole 7 is completely removed, and only the contact hole 7 remains filled with the polysilicon. This polysilicon in the contact hole 7 becomes a first conductive layer 9. Next, a double diffusion barrier, formed of first and second layers 11 and 13, is sequentially formed over the surface of semiconductor substrate 1 including the first conductive layer 9. Then, a second conductive layer 15 is formed on the diffusion barrier 11 and 13. Thereafter, a photoresist 17 is deposited to cover the second conductive layer 15.

The first and second layers 11 and 13 of the diffusion barrier can be a titanium (Ti) layer and a nitride titanium (TIN) layer, respectively. The second conductive layer 15 is preferably formed of Pt and acts as the lower storage node of the capacitor.

FIG. 3 shows the step of forming an upper storage node. First, the photoresist 17 shown in FIG. 2 is patterned. Then the second conductive layer 15 and the diffusion barrier layer 11 and 13 are anisotropically etched using the photoresist pattern as a mask. As a result, a second conductive layer pattern 15a and a diffusion barrier layer pattern 1 la and 13a are formed. The anisotropic etching is performed until it reaches the surface of first insulating film 3. A second insulating film 19 is then formed by a sputtering method on the surface of the semiconductor substrate 1 including the resultant patterned structure. The second insulating film 19 is then annealed. After the annealing, a third insulating film 21 is formed on the overall surface of second insulating film 19. The third insulating film 21 acts as the upper storage node of the capacitor and is formed of Pt.

In this conventional capacitor manufacturing method, sufficient capacitance can be obtained using a simple stacked storage node in a capacitor since BST, which has a high dielectric constant, is used as the dielectric film. However, due to the oxygen atoms generated in the annealing step, a metal oxide ($TiO_x$) and nitrogen gas are both formed in the interface between the lower storage node of the capacitor

4

(second conducting layer 15a) and the portion of the TiN film forming a patterned second layer 13a in the patterned diffusion barrier. The nitrogen gas becomes trapped at the interface of the lower storage node and the TiN film, thereby making the lower storage node partially swollen and its surface rough. As a result of this, the capacitance of the capacitor is undesirably decreased.

One option the inventors pursued to solve this problem was to oxidize a portion of the TiN layer to prevent further oxidation of Ti through the reaction of the TiN and oxygen atoms. By completely oxidizing the TiN in advance, the above problem can be avoided. However, this raises the additional problem of undesirably increasing the resistance of the TiN thin film.

SUMMARY OF THE INVENTION

It is an object of the present invention to provide a capacitor having a triple film between a first insulating film and a lower storage node to avoid the problems present in the s prior art.

It is another object of the present invention to provide an appropriate method for manufacturing the capacitor having a triple film between a first insulating film and a lower storage node.

To achieve the above objects, there is provided a capacitor comprising a first insulating film formed on a semiconductor and having a contact hole in the center; a spacer formed on the inner wall of the contact hole; a first conductive layer filling the contact hole; a triple film formed on the first insulating film, the triple film including three layers, at least one of the three layers being formed of a nonoxidizing material; a second conductive layer formed on the triple film; a second insulating film formed on the overall surface of the resultant structure; and a third conductive layer formed on the overall surface of the second insulating film, wherein a layer formed of a nonoxidizing material is placed between the second conducting layer and any of the To achieve another object, there is provided a method for manufacturing a capacitor, including the steps of forming a first insulating film having a contact hole on the surface of a semiconductor substrate; forming a spacer on the inner wall of the contact hole; filling the contact hole with a first conductive layer; forming a triple layer on the first conductive layer and the first insulating film, the triple layer including three layers, at least one of the three layers being formed of a nonoxidizing material; forming a second conductive layer on the triple layer; forming a second insulating film on the first conductive layer, the triple layer, and the first insulating film; and forming a third conductive layer on the second insulating The first insulating film is formed of a BPSG film. The triple film acts as a diffusion barrier layer and is formed by depositing a Ti film, a TiN film and a Ta film. The Ti film functions as an ohmic contact, and is formed to have a thickness of approximately 50–100 Å. The TiN film serves to prevent the oxidation of silicon and is formed to have a thickness of approximately 200 Å. The Ta film serves to prevent the TiN film from being oxidized and is formed to have a thickness of 200 Å or less to contribute to the dynamic stability of the lower storage node by reducing thermal stress. The second and third conductive layers act as the lower and upper storage nodes, respectively, and are formed of platinum which is a refractory metal. The height of the step formed between the center and the rest of the first insulating film is approximately 500 Å. The purpose of forming the first insulating film is to isolate the storage nodes from one another and suppress stray capacitance. The second insulating film formed on the storage node pattern is preferably formed of a BSTO series material.

In the present invention, the oxidation of a TiN film is prevented by forming a diffusion barrier layer of the conventional diffusion barrier layer and a Ta film added thereto, thereby maintaining the stability of a capacitor's lower storage node. As a result, the capacitance of the capacitor can be maintained without any loss.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF A PREFERRED EMBODIMENT OF THE INVENTION

A capacitor and a manufacturing method thereof according to a preferred embodiment of the present invention will be described in detail, with reference to FIGS. 4 to 7.

Figure 1:
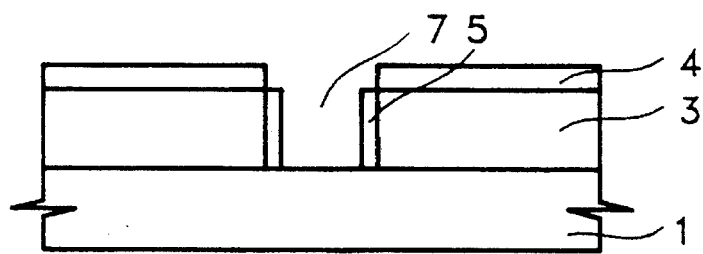
FIGS. 1 to 3 illustrate the steps of a process in a conventional capacitor manufacturing method.
Figure 2:
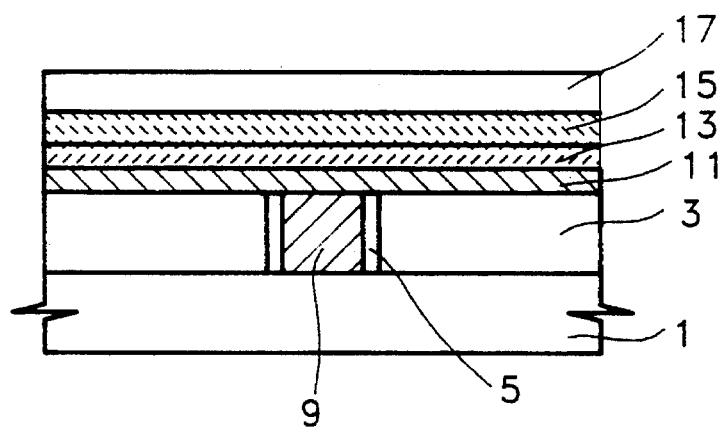
Figure 3:
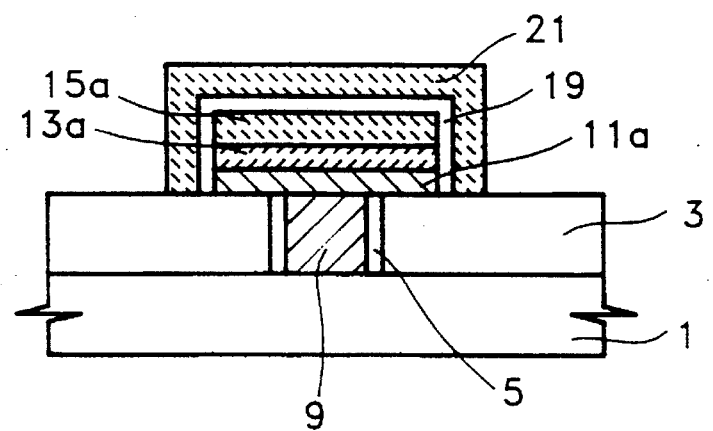
Figure 4:
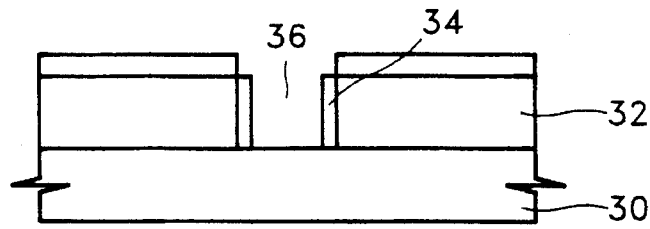
FIGS. 4 to 7 illustrate the steps of a process in a capacitor manufacturing method according to a preferred embodiment of the present invention.

FIG. 4 shows the step of forming a contact hole 36 in a first insulating film 32. The contact hole 36 is formed by depositing the first insulating film 32 on a semiconductor substrate 30 and then etching the contact hole 36 in the first insulating film 32. Then, a spacer 34 is formed on the inner walls of contact hole 36. The steps shown in FIG. 4 can be performed, for example, in the same manner disclosed in FIG. 1 and described in the Background of the Invention. In these steps, the first insulating film 32 is preferably formed of a BPSG.

Figure 5:
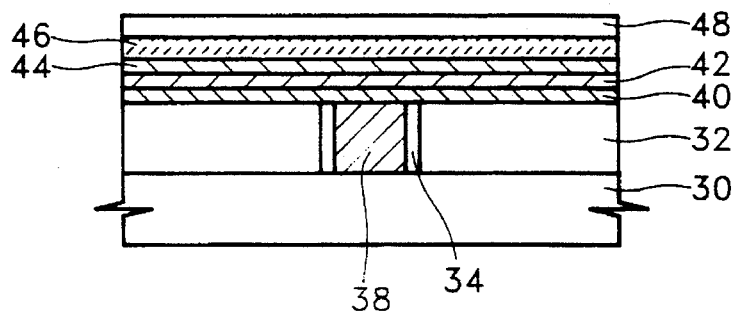

FIG. 5 illustrates the steps of forming a triple film and forming a second conductive layer. First, the contact hole 36 is completely filled with polysilicon to form a first conductive layer 38, which has been ion-implanted with a conductive impurity. Then, a triple film, including three layers 40, 42 and 44, is formed on the surface of the first conductive layer 38 and the first insulating film 32. Finally, a second conductive layer 46 is formed on the triple film and a photoresist layer 48 is formed on the second conductive layer 46.

The triple film acts as a diffusion barrier layer. It preferably includes a Ti layer 40, a TiN layer 42, and a Ta layer 44, although any similar materials can be used to form the layers provided one layer is made of a nonoxidizing material. The Ti film 40 serves as an ohmic contact for first conductive layer 38, and is preferably formed by a sputtering method to be approximately 50–100 Å thick. The TiN film 42 is preferably formed by a reactive sputtering method to be approximately 200 Å thick. The Ta layer 44 is preferably formed by a sputtering method to be no more than 200 Å thick to reduce thermal stress.

The second conductive layer 46 is preferably formed directly on the Ta layer 44. In this way, the Ta layer 44 prevents nitrogen gas and a metal oxide from being produced by the TiN molecules from the TiN layer 42 combining with oxygen atoms that are generated in a thermal process after the formation of a second insulating film 46.

Figure 6:
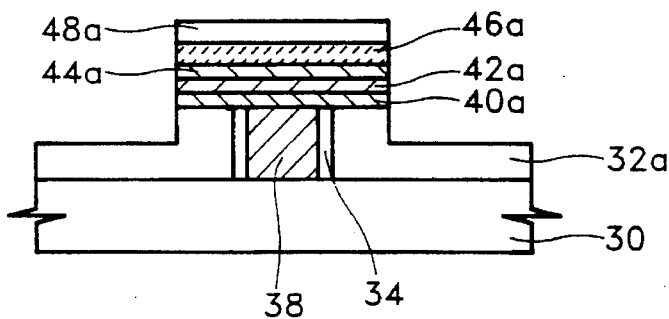

FIG. 6 shows the formation of a storage node pattern. To create this storage node pattern, the photoresist 48 shown in FIG. 5 is first patterned into a photoresist pattern 48a to define the shape of the storage node pattern. Then, the second insulating film 46 and the triple film 40, 42 and 44 shown in FIG. 5 are anisotropically etched using the photoresist pattern 48a. Finally, the portions of the first insulating film 32 which are exposed by photoresist pattern 48a are anisotropically etched to a predetermined depth, thus forming a second conductive layer pattern 46a, a triple film pattern 40a, 42a and 44a, and the first insulating film pattern 32a.

The storage node pattern comprises the second conductive layer pattern 46a, the triple film pattern 40a, 42a and 44a, and the first insulating film pattern 32a.

The first insulating film pattern 32a is preferably formed by etching the first insulating film 32 of FIG. 5 to a depth of approximately 500 Å from the interface between first insulating film 32 and Ti film pattern 40a of the triple film pattern 40a, 42a and 44a. In this way, the first insulating film pattern 32a forms a step down between the contact hole 36 and the rest of the first insulating film 32. The first insulating film pattern 32a is necessary to isolate storage nodes from one another in the memory device and to suppress stray capacitance.

Figure 7:
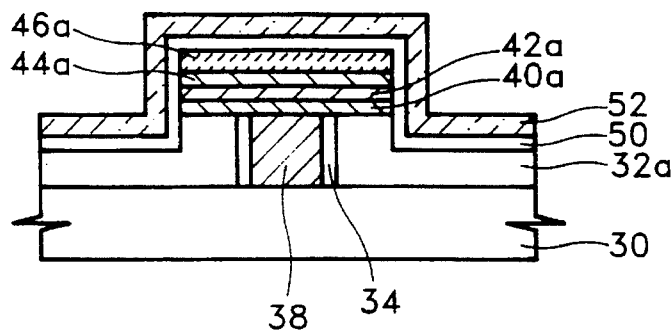

FIG. 7 shows the step of forming an upper storage node 52. First, the photoresist pattern 48a from FIG. 6 is removed. Then, a second insulating film 50 is preferably formed at 600° C. to have a thickness of approximately 400 Å on the storage node pattern. The second insulating film 50 is preferably formed of a BSTO series material. Next, a third conductive layer 52, preferably formed of Pt, is deposited on the surface of the second insulating film 50. Finally, the subsequent fabrication steps of the capacitor proceed according to a well-known method (not shown).

As described above, in a preferred embodiment of the present invention, the diffusion barrier layer is formed to be a triple film comprising a Ti layer, a TiN layer, and a Ta layer. By including a Ta layer, this invention has the advantage of preventing the formation of a metal oxide and nitrogen gas by the reaction of TiN and oxygen. This invention also has the advantage of reducing thermal stress by forming the Ta film as thin as possible.

Consequently, the lower storage node of the capacitor can be chemically and dynamically stable and the roughness and lift-off of the lower storage node due to nitrogen gas can be prevented. This prevents the decrease of the capacitance of the capacitor due to the formation of a metal oxide and avoids the creation of an unstable lower storage node.

The present invention is not limited to the above embodiment, and it is clearly understood that those of ordinary skill in the art will contemplate many variations and modifications to the foregoing exemplary embodiments that fall within the scope and spirit of the present invention as set forth in the attached claims.

What is claimed is:

1. A capacitor comprising:

a first insulating film formed on a semiconductor;

a contact hole formed in the first insulating film;

a spacer formed on an inner wall of the contact hole;

a first conductive layer filling the contact hole;

a triple film formed over the first insulating film, the triple film including three layers, at least one of the three layers being formed of a nonoxidizing material;

a second conductive layer formed on the triple film;

a second insulating film formed on the overall surface of the resultant structure; and a third conductive layer formed on the overall surface of the second insulating film, wherein a layer of the triple film formed of a nonoxidizing material is placed between the second conducting layer and any of the layers in the triple film formed of an oxidizing material.

2. A capacitor as in claim 1, wherein the first insulating film has at least one step between the contact hole and the rest of the first insulating film.

3. A capacitor as in claim 2, wherein the height of the step between the contact hole and the rest of the first insulating film is approximately 500 Å.

4. A capacitor as claim 1, wherein the first insulating film is a borophosphosilicate glass (BPSG) film.

5. A capacitor as in claim 1, wherein the triple film is a diffusion barrier layer.

6. A capacitor as in claim 1, wherein the three layers in the triple film are a Ti layer, a TiN layer, and a Ta layer.

7. A capacitor as in claim 6, wherein the Ti layer is approximately 50–100 Å in thickness.

8. A capacitor as in claim 6, wherein the TiN layer is approximately 200 Å in thickness.

9. A capacitor as in claim 6, wherein the Ta layer is 200 Å or less in thickness.

10. A capacitor as in claim 6, wherein the second and third conductive layers are formed of platinum.

11. A capacitor manufacturing method including the steps of:

forming a first insulating film having a contact hole on the surface of a semiconductor substrate;

forming a spacer on the inner wall of the contact hole;

filling the contact hole with a first conductive layer;

forming a triple layer on the first conductive layer and the first insulating film, the triple layer including three layers, at least one of the three layers being a nonoxidizing layer;

forming a second conductive layer on the triple layer;

forming a second insulating film on the first conductive layer, the triple layer, and the first insulating film; and forming a third conductive layer on the second insulating film.

12. A capacitor manufacturing method as in claim 11, wherein the first insulating film is formed with at least one step between the center hole and the rest of the first insulating film.

13. A capacitor manufacturing method as in claim 12, wherein the height of the step between the center and the rest of the first insulating film is approximately 500 Å.

14. A capacitor manufacturing method as claim 11, wherein the first insulating film is a borophosphosilicate glass (BPSG) film.

15. A capacitor manufacturing method as claim 11, wherein the triple film is a diffusion barrier layer.

16. A capacitor manufacturing method as in claim 11, wherein the three layers in the triple film are a Ti layer, a TiN layer, and a Ta layer.

17. A capacitor manufacturing method as in claim 16, wherein the Ti layer is formed to be approximately 50–100 Å in thickness.

18. A capacitor manufacturing method as in claim 16, wherein the TiN layer is formed to be approximately 200 Å in thickness.

19. A capacitor manufacturing method as in claim 16, wherein the Ta layer is formed to be 200 Å or less in thickness.

20. A capacitor manufacturing method as in claim 16, wherein the second and third conductive layers are formed of platinum.

* * * * *